(12) United States Patent
Boyd et al.

(10) Patent No.: US 8,323,460 B2
(45) Date of Patent: Dec. 4, 2012

(54) METHODS AND SYSTEMS FOR THREE-DIMENSIONAL INTEGRATED CIRCUIT THROUGH HOLE VIA GAPFILL AND OVERBURDEN REMOVAL

(75) Inventors: John Boyd, Woodlawn (CA); Fritz Redeker, Fremont, CA (US); Yezdi Dordi, Palo Alto, CA (US); Hyungsuk Alexander Yoon, San Jose, CA (US); Shijian Li, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 761 days.

(21) Appl. No.: 11/820,810

(22) Filed: Jun. 20, 2007

(65) Prior Publication Data
US 2008/0314756 A1    Dec. 25, 2008

(51) Int. Cl.
*C25D 17/00* (2006.01)
(52) U.S. Cl. ............ 204/224 R; 204/224 M; 204/252
(58) Field of Classification Search .......... 204/224 R, 204/224 M, 252
See application file for complete search history.

(56) References Cited

U.S. PATENT DOCUMENTS

| | | | |
|---|---|---|---|
| 5,256,565 A | 10/1993 | Bernhardt et al. | |
| 6,777,831 B2 * | 8/2004 | Gutierrez et al. | 307/412 |
| 6,860,944 B2 | 3/2005 | Ivanov et al. | |
| 6,864,181 B2 | 3/2005 | Redeker et al. | |
| 6,913,651 B2 | 7/2005 | Ivanov et al. | |
| 7,128,803 B2 | 10/2006 | Owczarz et al. | |
| 7,153,400 B2 | 12/2006 | Ravkin et al. | |
| 7,198,055 B2 | 4/2007 | Woods et al. | |
| 7,234,477 B2 | 6/2007 | de Larios et al. | |
| 7,306,662 B2 | 12/2007 | Vaskelis et al. | |
| 2004/0069329 A1 * | 4/2004 | de Larios et al. | 134/95.2 |
| 2004/0178060 A1 * | 9/2004 | Ravkin et al. | 204/232 |
| 2005/0042861 A1 | 2/2005 | Redeker et al. | |
| 2005/0284748 A1 | 12/2005 | Dordi et al. | |
| 2005/0284767 A1 | 12/2005 | Dordi et al. | |
| 2006/0260932 A1 | 11/2006 | Ravkin et al. | |
| 2006/0266653 A1 * | 11/2006 | Birang et al. | 205/83 |
| 2007/0051619 A1 * | 3/2007 | Mazur et al. | 204/250 |
| 2007/0051639 A1 | 3/2007 | Mazur et al. | |
| 2007/0227656 A1 | 10/2007 | Boyd et al. | |
| 2007/0264436 A1 | 11/2007 | Dordi et al. | |

OTHER PUBLICATIONS

U.S. Appl. No. 10/882,712, filed Jun. 30, 2004, Inventors: Dordi, et al.

(Continued)

*Primary Examiner* — Luan Van
(74) *Attorney, Agent, or Firm* — Larry Williams; Williams IPS

(57) ABSTRACT

Presented are methods and systems for fabricating three-dimensional integrated circuits having large diameter through-hole vias. One embodiment of the present invention provides a method of processing a wafer having holes for through-hole vias. The method comprises plating a gapfill metal on the wafer. The method also comprises chemically or electrochemically deplating a portion of the overburden metal. The method further comprises using chemical mechanical planarization to planarize the gapfill metal and to remove the remaining overburden metal. Another embodiment of the present invention is an integrated system comprising a process chamber for containing the wafer, a plating component integrated with the process chamber, and a deplating component integrated with the process chamber. The plating component is configured to electrochemically plate a gapfill metal onto the wafer to a least partially fill the holes. The deplating component is configured to chemically or to electrochemically remove a portion of the overburden metal formed by the plating component.

31 Claims, 7 Drawing Sheets

OTHER PUBLICATIONS

U.S. Appl. No. 11/394,777, filed Mar. 31, 2006, Inventors: Boyd, et al.
U.S. Appl. No. 11/539,155, filed Oct. 5, 2006, Inventors: Thie, et al.
U.S. Appl. No. 11/539,611, filed Oct. 6, 2006, Inventors: Woods, et al.
U.S. Appl. No. 11/820,811, filed Jun. 20, 2007, Inventors: Boyd, et al.
U.S. Appl. No. 11/821,051, filed Jun. 20, 2007, Inventors: Boyd, et al.
Numerical Simulation of Electrochemical Planarization of Copper Overburden, West, et al., *Journal of the Electrochemical Society*, 152 (10) C652-C656 (available electronically on Aug. 11, 2005).

* cited by examiner

METHODS AND SYSTEMS FOR THREE-DIMENSIONAL INTEGRATED CIRCUIT THROUGH HOLE VIA GAPFILL AND OVERBURDEN REMOVAL

CROSS REFERENCE

This application is related to U.S. patent application Ser. No. 11/820,811, titled "METHODS OF POST-CONTACT BACK END OF LINE THROUGH-HOLE VIA INTEGRATION," to Boyd et al., filed same day as for present application; U.S. patent application Ser. No. 11/821,051, titled "METHODS AND APPARATUSES FOR THREE DIMENSIONAL INTEGRATED CIRCUITS," to Boyd et al., filed same day as for present application; U.S. patent application Ser. No. 11/395,881, filed Mar. 31, 2006; U.S. patent application Ser. No. 11/394,777, filed Mar. 31, 2006; U.S. patent application Ser. No. 11/539,611, filed Oct. 6, 2006; U.S. patent application Ser. No. 11/382,906, filed May 11, 2006; U.S. patent application Ser. No. 11/494,997, filed Jul. 28, 2006; and U.S. Pat. No. 7,153,400; all of these patents and/or applications are incorporated herein, in their entirety, by this reference.

BACKGROUND

This invention pertains to three dimensional integrated circuits and methods, and systems for fabricating three-dimensional integrated circuits; more specifically this invention relates to methods and systems for interconnect metallization of three-dimensional integrated circuits.

A three-dimensional integrated circuit includes two or more semiconductor chips with integrated circuits or includes two or more semiconductor wafers with integrated circuits. The semiconductor chips or semiconductor wafers are stacked together, bonded, and electrically interconnected in three dimensions, i.e., integrated within the semiconductor chips or semiconductor wafers and integrated between the semiconductor chips or semiconductor wafers. The interconnections between the chips or between the wafers are accomplished by way of through holes from the back side to the front side of one or more of the chips or one or more of the semiconductor wafers. In other words, the electrical connections between the stack of chips or stack of wafers are made by way of the through holes. Three-dimensional integrated circuits may have a large number of through holes for interconnect metallization between the semiconductor chips or between the semiconductor wafers.

Three-dimensional integrated circuits, according to some designs, will use through-hole vias that are large, high aspect ratio features with dimensions an order of magnitude or more larger than the minimum geometry features for standard technology dual damascene metallization interconnects. Standard technology electroplating chemistry for metallization of semiconductor devices deposits a layer of metal to fill holes, trenches, and other features for gapfill. In addition to providing gapfill, overburden metal is also deposited. The overburden metal includes the portion of the metal that is deposited outside of the holes, the trenches, and the other features that are being filled. For through-hole vias, the overburden metal is the portion of the layer of metal that is deposited outside of the holes for the through hole vias. The overburden that forms in conjunction with through-hole via gapfill is thicker than that which usually occurs for two dimensional integrated circuit metallization because of the larger dimensions of the features filled for through-hole vias.

Of course, the chemical mechanical planarization process that usually follows metal gapfill is used to remove overburden metal and can be used to remove the overburden that occurs during gapfill for through hole vias for three-dimensional integrated circuits. However, chemical mechanical planarization is a slow, expensive process that may be impractical for some of the requirements of fabricating three-dimensional integrated circuits. The cost effective production of three dimensional integrated circuits will probably be more achievable if the excessive overburden metal can be removed or minimized.

Practical and cost effective fabrication of three-dimensional integrated circuits will require new processes and systems capable of meeting the requirements for metallization of three-dimensional integrated circuits. More specifically, there is a need for new processes and systems capable of meeting the unusual aspect ratio requirements for gapfill metal deposition for through hole vias in three-dimensional integrated circuits while avoiding or better accommodating the excessive overburden metal associated with the through hole via gapfill.

SUMMARY

This invention pertains to methods and systems for fabricating three-dimensional integrated circuits having large diameter through-hole vias. The present invention seeks to overcome one or more of the deficiencies of the standard technologies for fabricating three-dimensional integrated circuits such as integrated stacks of semiconductor chips or semiconductor wafers with integrated circuits.

One aspect of the present invention is a method of manufacturing three-dimensional integrated circuits. One embodiment of the present invention provides a method of processing a wafer having holes for through-hole vias for the three-dimensional integrated circuits. The method comprises plating a gapfill metal on the wafer while holding the wafer in a first process chamber. The method also comprises chemically or electrochemically deplating a portion of overburden metal while holding the wafer in the first process chamber. The method further comprises moving the wafer to a chemical mechanical planarization chamber before complete removal of the overburden metal and using chemical mechanical planarization to planarize the gapfill metal and to remove the remaining overburden metal.

One aspect of the present invention is an integrated system configured for processing a wafer having holes for through-hole vias for three-dimensional integrated circuits. In one embodiment, the integrated system comprises a process chamber for containing the wafer, a plating component integrated with the process chamber, and a deplating component integrated with the process chamber. The plating component is configured to electrochemically plate a gapfill metal onto the wafer to fill the holes. The deplating component is configured to chemically or electrochemically remove a portion of overburden metal formed by the plating component.

It is to be understood that the invention is not limited in its application to the details of construction and to the arrangements of the components set forth in the following description or illustrated in the drawings. The invention is capable of other embodiments and of being practiced and carried out in various ways. In addition, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods, and systems for carrying out aspects of the present invention. It is important, therefore, that the claims be regarded as including such equivalent constructions insofar as they do not depart from the spirit and scope of the present invention.

Figure 1:
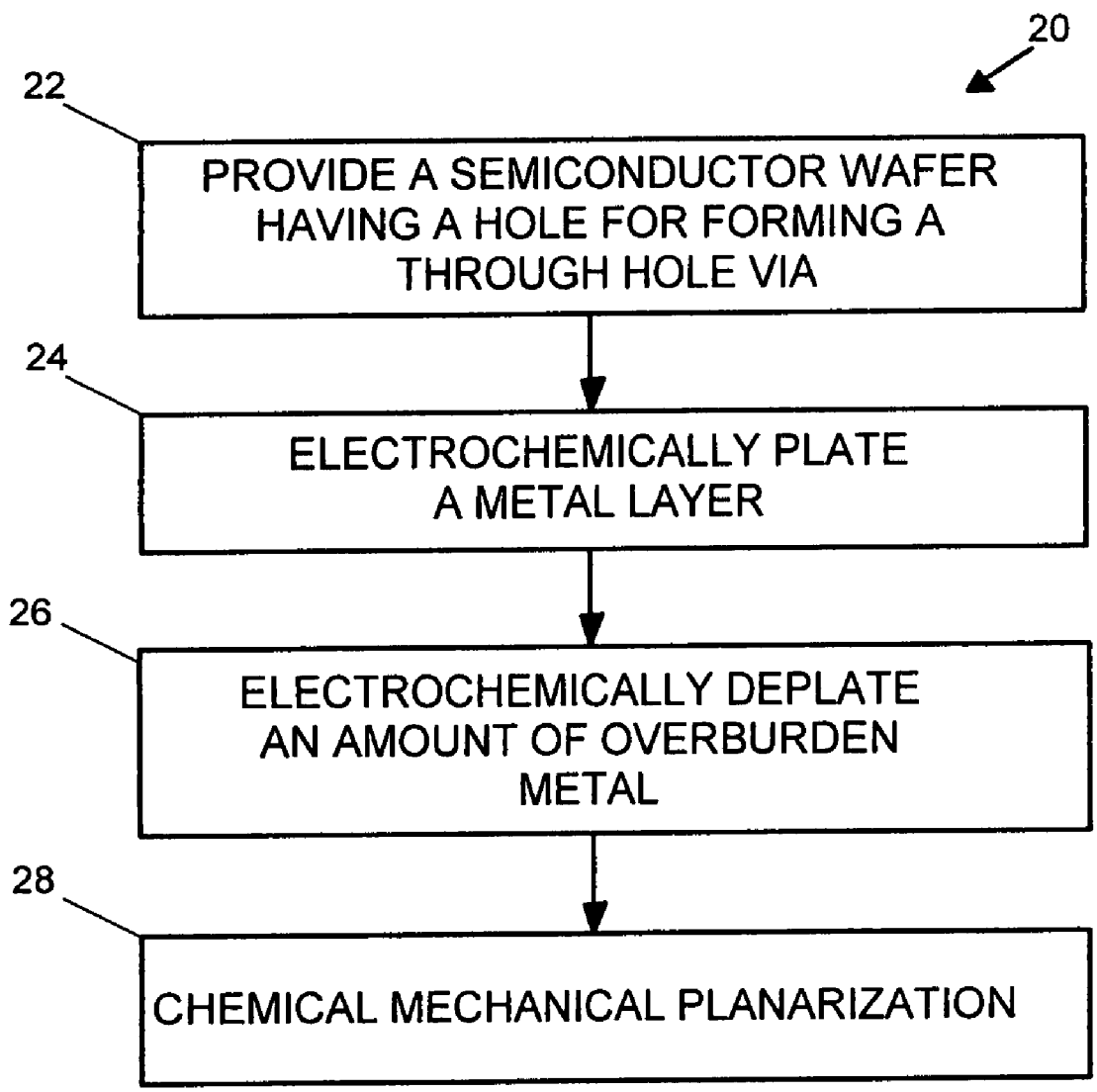
FIG. 1 is a process flow diagram of an embodiment of the present invention.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DESCRIPTION

The present invention pertains to interconnect metallization for three-dimensional integrated circuits. More specifically, the present invention pertains to filling holes for through-hole vias for metallization lines running through a semiconductor wafer or other substrate. The metallization is usually used for upper levels in three-dimensional integrated circuits.

The operation of embodiments of the present invention will be discussed below, primarily in the context of processing semiconductor wafers for use in stacked wafer three-dimensional integrated circuits. More specifically, the operation of embodiments of the present invention is discussed below in the context of processing silicon wafers for three-dimensional silicon integrated circuits that use copper metallization technology. However, it is to be understood that embodiments in accordance with the present invention may be used for other semiconductor devices, for semiconductors other than silicon, and for wafers other than semiconductor wafers.

In the following description of the figures, identical reference numerals have been used when designating substantially identical elements or steps that are common to the figures.

Reference is now made to FIG. 1 where there is shown a process flow diagram 20 according to one embodiment of the present invention. Process flow diagram 20 shows a method of processing a wafer, such as a semiconductor wafer, having holes for through-hole vias for three-dimensional integrated circuits. More specifically, process flow diagram 20 shows a method of metal gapfill of the holes for forming through-hole vias and removal of overburden formed during deposition of the gapfill metal. Process flow diagram 20 includes step 22, step 24, step 26, and step 28.

Step 22 includes providing a wafer such as a semiconductor wafer or other substrate having holes for through-hole vias for three-dimensional integrated circuits. According to a preferred embodiment of the present invention, the wafer comprises a semiconductor wafer such as a silicon wafer suitable for forming integrated circuits therein. The through hole vias provide electrical interconnection between one or more of the wafers in a vertical stack of the wafers bonded together to form the three-dimensional circuit integration. As an alternative, the wafer may comprise a wafer of an insulating material such as a silicon dioxide wafer or an aluminum oxide wafer supporting a layer of a semiconductor or a section of a semiconductor wafer.

The holes for the through hole vias are blind holes fabricated so that they have a width necessary for a through hole via and a depth sufficient to allow the blind holes to be opened to form a through hole via. For many applications, the size of the holes for through hole vias is much greater than holes used for vias in two-dimensional integrated circuits. For some embodiments of the present invention, the holes for the through-hole vias have diameters of 5 to 10 micrometers and depths of 25 to 40 micrometers. Embodiments of the present invention can be used to process wafers with vias and trenches for damascene or dual damascene metallization for wafers for two-dimensional integrated circuits.

Step 24 includes wet chemical deposition of a gapfill metal layer to at least partially fill the holes. As an option for some embodiments of the present invention, the gapfill metal is deposited to substantially fill the holes. According to a preferred embodiment of the present invention, step 24 includes electrochemically plating the gapfill metal on the wafer while holding the wafer in a first process chamber. A preferred metal for the gapfill is a metal such as copper. Wet chemical processing for gapfill using copper is a known technology; numerous options exist for copper gapfill technology. Although electrochemical plating is a preferred method for depositing the gapfill metal, processes such as electroless deposition may also be used for embodiments of the present invention.

For preferred embodiments of the present invention, the plating of the gapfill metal is accomplished by localized proximity head electrochemical plating. More specifically, the plating of the gapfill metal is accomplished by localized proximity head electrochemical plating using a first proximity head to confine a volume of electrochemical plating fluid within an area beneath the first proximity head. Preferably, the area is less than an entirety of the wafer surface. Suitable processes of localized proximity head electrochemical plating are disclosed in commonly owned U.S. patent application Ser. No. 11/494,997, filed Jul. 28, 2006; and U.S. Pat. No. 7,153,400. Overburden metal is usually formed in wet chemical gapfill processes such as electrochemical plating and electroless plating of metals such as copper, for examples of such systems see U.S. patent application Ser. No. 10/882,712 filed Jun. 30, 2004, Ser. No. 10/879,396 filed Jun. 28, 2004 and Ser. No. 11/539,155 filed Oct. 5, 2006 and U.S. Pat. Nos. 6,860,944 and 6,913,651.

Step 26 includes electrochemically deplating an amount of the overburden metal formed in step 24. In other words step 26 involves electrochemically removing a portion of the thickness of the overburden metal. Step 26 is intentionally performed so that the overburden metal is not completely removed and so that a sufficient amount of overburden metal remains to permit effective planarization of the gapfill metal in the holes. In preferred embodiments, about 90% of the thickness of the overburden metal is removed in step 26. According to a preferred embodiment of the present invention, step 24 and step 26 are performed while holding the wafer in the first process chamber.

For preferred embodiments of the present invention, the deplating of the portion of the thickness of the overburden metal is accomplished with a localized proximity head. More specifically, electrochemical deplating of the portion of overburden metal is accomplished by localized proximity head electrochemical etching. According to one embodiment of the present invention, electrochemically deplating the portion of overburden metal is accomplished by localized proximity head electrochemical etching using a second proximity head to confine a volume of electrochemical deplating fluid within an area beneath the second proximity head. The area is less than an entirety of the wafer surface.

According to a more preferred embodiment of the present invention, the electrochemical deplating of the portion of overburden metal is accomplished by localized proximity head electrochemical etching using a low conductivity solvent such as deionized water contacting the overburden metal, a negatively biased electrolyte solution, and a cation transfer membrane. One side of the cation transfer membrane contacts the deionized water. The cation transfer membrane is disposed so as to separate the deionized water from the negatively biased electrolyte solution. The negatively biased electrolyte solution is held so that it contacts the opposite side of the cation transfer membrane.

This configuration causes cations generated from the plated metal to form in the deionized water contacting the plated metal. In other words, the negatively biased electrolyte solution is electrically charged as a cathode for enabling a consumable chemical reaction involving the plated metal. The cations are conveyed from the deionized water by way of the cation transfer membrane to the negatively biased electrolyte solution, effecting a reduction in the thickness of the plated metal contacting or near the cation transfer membrane.

Step 28 includes using chemical mechanical planarization to complete the removal of the overburden metal left in step 26 and to isolate and planarize the gapfill metal in the holes. Suitable processes for chemical mechanical planarization are known to persons of ordinary skill in the art; consequently, details of the chemical mechanical planarization process will not be presented here. According to preferred embodiments of the present invention, step 28 is performed in a chemical mechanical planarization process chamber. Preferably, step 28 includes moving the wafer to a chemical mechanical planarization chamber.

Figure 1A:
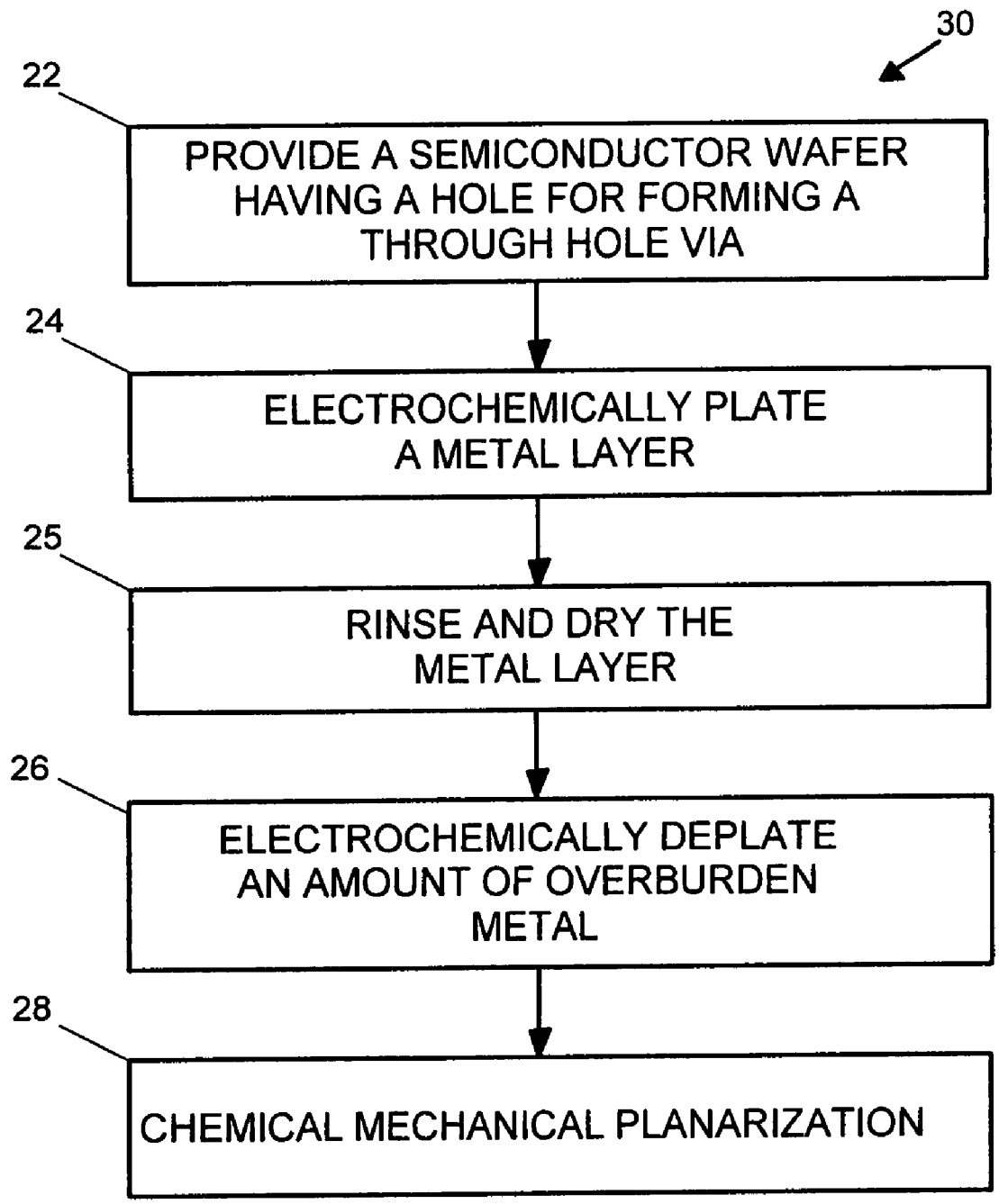
FIG. 1A is a process flow diagram of an embodiment of the present invention.

Reference is now made to FIG. 1A where there is shown a process flow diagram 30 according to one embodiment of the present invention. Process flow diagram 30 shows a method of processing a wafer, such as a semiconductor wafer, having holes for through-hole vias for three-dimensional integrated circuits. More specifically, process flow diagram 30 shows a method of metal gapfill of the holes for forming through-hole vias for three-dimensional integrated circuits and removal of overburden formed during deposition of the gapfill metal. Process flow diagram 30 includes step 22, step 24, step 25, step 26, and step 28.

Step 22 includes providing a wafer such as a semiconductor wafer or other substrate having holes for through hole vias for three dimensional integrated circuits. According to a preferred embodiment of the present invention, the wafer comprises a semiconductor wafer such as a silicon wafer suitable for forming integrated circuits therein. The through hole vias provide electrical interconnection between one or more of the wafers in a vertical stack of the wafers bonded together to form the three-dimensional circuit integration. As an alternative, the wafer may comprise a wafer of an insulating material such as a silicon dioxide wafer or an aluminum oxide wafer supporting a layer of a semiconductor or a section of a semiconductor wafer.

The holes for the through hole vias are blind holes fabricated so that they have a width necessary for a through hole via and a depth sufficient to allow the blind holes to be opened to form a through hole via. For many applications, the size of the holes for through-hole vias is much greater than holes used for vias in two-dimensional integrated circuits. For some embodiments of the present invention, the holes for the through-hole vias have diameters of 5 to 10 micrometers and depths of 25 to 40 micrometers.

Step 24 includes wet chemical deposition of a gapfill metal layer to at least partially fill the holes. As an option for some embodiments of the present invention, the gapfill metal is deposited to substantially fill the holes. According to a preferred embodiment of the present invention, step 24 includes electrochemically plating the gapfill metal on the wafer while holding the wafer in a first process chamber. A preferred metal for the gapfill is a metal such as copper. Wet chemical processing for gapfill using copper is a known technology; numerous options exist for copper gapfill technology. Although electrochemical plating is a preferred method for depositing the gapfill metal, processes such as electroless deposition may also be used for embodiments of the present invention.

For preferred embodiments of the present invention, the plating of the gapfill metal is accomplished by localized proximity head electrochemical plating. More specifically, the plating of the gapfill metal is accomplished by localized proximity head electrochemical plating using a first proximity head to confine a volume of electrochemical plating fluid within an area beneath the first proximity head. Preferably, the area is less than an entirety of the wafer surface. Suitable processes of localized proximity head electrochemical plating are disclosed in commonly owned U.S. patent application Ser. No. 11/494,997, filed Jul. 28, 2006 and U.S. Pat. No. 7,153,400. Overburden metal is usually formed in wet chemical gapfill processes such as electrochemical plating and electroless plating of metals such as copper.

Step 25 includes rinsing and drying the plated metal to clean the surface of liquids used in step 24. A variety of methods can be used for rinsing and drying the plated metal. According to a preferred embodiment of the present invention, the rinsing and drying of plated metal is performed using a process such as one or more of the processes described in commonly owned U.S. Pat. No. 7,198,055 and U.S. patent application Ser. No. 10/261,839, filed Sep. 30, 2002; the contents of which are incorporated herein, in their entirety, by this reference. As an option for embodiments of the present invention, the rinsing and drying of the surface of the plated metal is accomplished using localized proximity head rinsing and drying and includes using a proximity head to confine a volume of rinsing fluid within an area beneath the proximity head. Preferably, the area is less than an entirety of the wafer surface.

Step 26 includes electrochemically deplating an amount of the overburden metal formed in step 24. In other words step 26 involves electrochemically removing a portion of the thickness of the overburden metal. Step 26 is intentionally performed so that the overburden metal is not completely removed and so that a sufficient amount of overburden metal remains to permit effective planarization of the gapfill metal in the holes. In preferred embodiments, about 90% of the thickness of the overburden metal is removed in step 26. According to a preferred embodiment of the present invention, step 24, step 25, and step 26 are performed while holding the wafer in the first process chamber.

For preferred embodiments of the present invention, the deplating of the portion of the overburden metal is accomplished with a localized proximity head. More specifically, electrochemical deplating of the portion of overburden metal is accomplished by localized proximity head electrochemical etching. According to one embodiment of the present invention, electrochemically deplating the portion of overburden metal is accomplished by localized proximity head electrochemical etching using a second proximity head to confine a volume of electrochemical deplating fluid within an area beneath the second proximity head, the area being less than an entirety of the wafer surface.

According to a more preferred embodiment of the present invention, the electrochemical deplating of the portion of overburden metal is accomplished by localized proximity head electrochemical etching using a low conductivity solvent such as deionized water contacting the overburden metal, a negatively biased electrolyte solution, and a cation transfer membrane. One side of the cation transfer membrane contacts the deionized water. The cation transfer membrane is disposed so as to separate the deionized water from the negatively biased electrolyte solution. The negatively biased electrolyte solution is held so that it contacts the opposite side of the cation transfer membrane.

This configuration causes cations generated from the plated metal to form in the deionized water contacting the plated metal. In other words, the negatively biased electrolyte solution is electrically charged as a cathode for enabling a consumable chemical reaction involving the plated metal. The cations are conveyed from the deionized water by way of the cation transfer membrane to the negatively biased electrolyte solution, effecting a reduction in the thickness of the plated metal contacting or near the cation transfer membrane.

Step 28 includes using chemical mechanical planarization to complete the removal of the overburden metal left in step 26 and to isolate and planarize the gapfill metal in the holes. Suitable processes for chemical mechanical planarization are known to persons of ordinary skill in the art; consequently, details of the chemical mechanical planarization process will not be presented here. According to preferred embodiments of the present invention, step 28 is performed in a chemical mechanical planarization process chamber. Preferably, step 28 includes moving the wafer to a chemical mechanical planarization chamber.

For some embodiments of the present invention, process flow 30 is accomplished using a plating head in step 24 and using a deplating head in step 26. Preferably, the plating head comprises an electrochemical processing proximity head configured for electrochemical plating and the deplating head comprises an electrochemical processing proximity head configured for electrochemical deplating. In other words, the plating head and the deplating head are independent components. In a preferred embodiment, process flow 30 is accomplished with the deplating head trailing the plating head. However, the deplating can occur at a later point in time after a portion of the plating is done or after all of the plating is completed.

In other embodiments of the present invention, process flow 30 can be performed using the same electrochemical processing head to accomplish step 24 and to accomplish step 26. The same process head is operable for plating and operable for deplating. Plating heads such as those described in commonly owned U.S. Pat. No. 7,153,400 can be suitably modified for plating or deplating by switching the electrical bias from positive to negative and, if needed, additional actions such as changing the fluid flow directions and/or compositions.

Figure 1B:
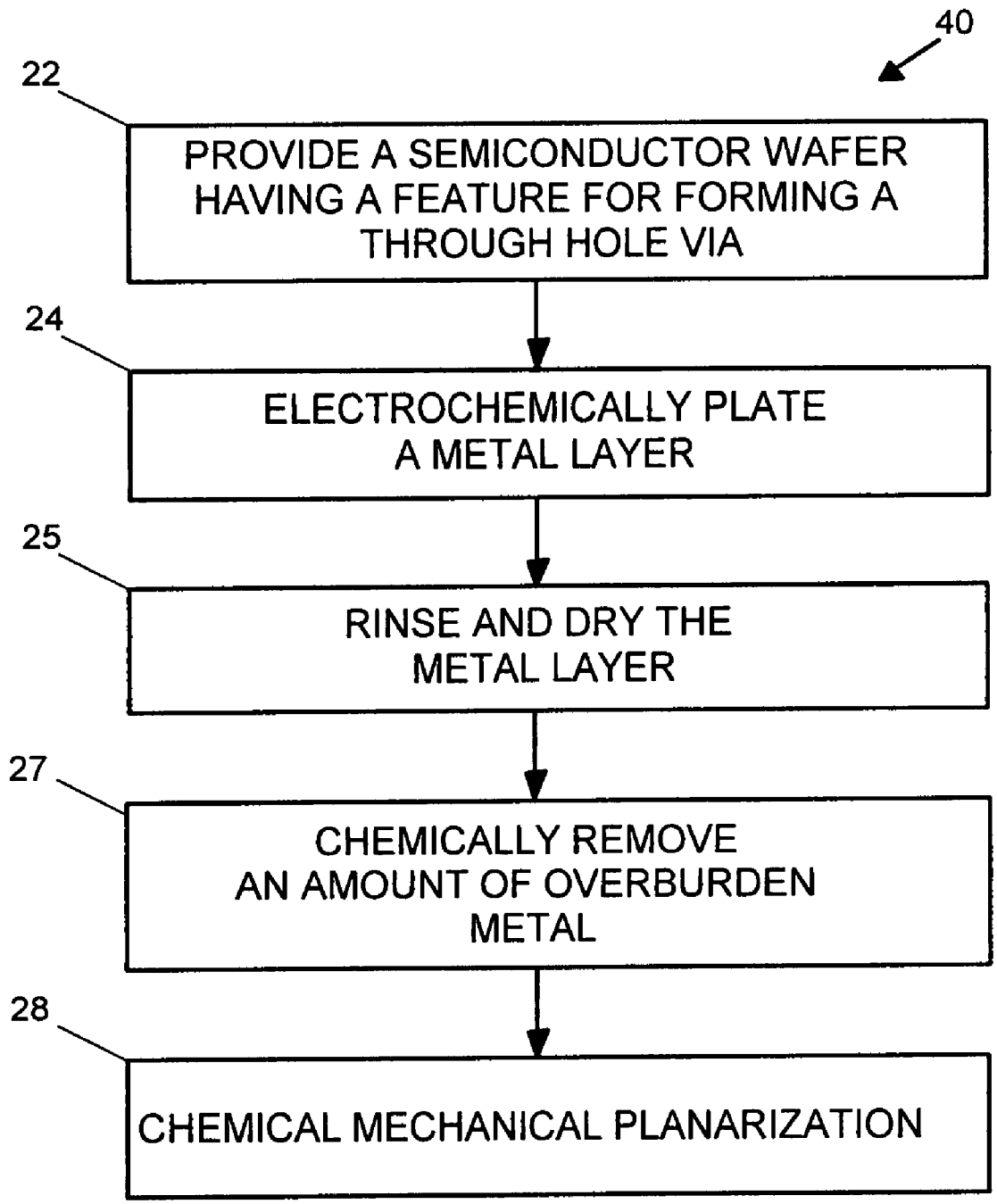
FIG. 1B is a process flow diagram of an embodiment of the present invention.

Reference is now made to FIG. 1B where there is shown a process flow diagram 40 according to one embodiment of the present invention. Process flow diagram 40 shows a method of processing a wafer, such as a semiconductor wafer, having holes for through-hole vias for three-dimensional integrated circuits. More specifically, process flow diagram 40 shows a method of metal gapfill of the holes for forming through-hole vias for three-dimensional integrated circuits and removal of overburden formed during deposition of the gapfill metal. Process flow diagram 40 includes step 22, step 24, step 25, step 27, and step 28.

Step 22 includes providing a wafer such as a semiconductor wafer or other substrate having holes for through hole vias for three dimensional integrated circuits. According to a preferred embodiment of the present invention, the wafer comprises a semiconductor wafer, such as a silicon wafer, suitable for forming integrated circuits therein. The through hole vias provide electrical interconnection between one or more of the wafers in a vertical stack of the wafers bonded together to form the three-dimensional circuit integration. As an alternative, the wafer may comprise a wafer of an insulating material such as a silicon dioxide wafer or an aluminum oxide wafer supporting a layer of a semiconductor or a section of a semiconductor wafer.

Step 24 includes wet chemical deposition of a gapfill metal layer to at least partially fill the holes. As an option for some embodiments of the present invention, the gapfill metal is deposited to essentially fill the holes. According to a preferred embodiment of the present invention, step 24 includes electrochemically plating the gapfill metal on the wafer while holding the wafer in a first process chamber. A preferred metal for the gapfill is a metal such as copper. Although electrochemical plating is a preferred method for depositing the gapfill metal, processes such as electroless deposition may also be used for embodiments of the present invention.

For preferred embodiments of the present invention, the plating of the gapfill metal is accomplished by localized proximity head electrochemical plating. More specifically, the plating of the gapfill metal is accomplished by localized proximity head electrochemical plating using a first proximity head to confine a volume of electrochemical plating fluid within an area beneath the first proximity head. Preferably, the area is less than an entirety of the wafer surface. Suitable processes of localized proximity head electrochemical plating are disclosed in commonly owned U.S. patent application Ser. No. 11/494,997, filed Jul. 28, 2006; and U.S. Pat. No. 7,153,400. Overburden metal is usually formed in wet chemical gapfill processes such as electrochemical plating and electroless plating of metals such as copper.

Step 25 includes rinsing and drying the surface of the plated metal to clean the surface of liquids used in step 24. A variety of methods can be used for rinsing and drying the plated metal. According to a preferred embodiment of the present invention, the rinsing and drying of the plated metal is performed using a process such as one or more processes described in commonly owned U.S. Pat. No. 7,198,055 and U.S. patent application Ser. No. 10/261,839, filed Sep. 30, 2002; the contents of which are incorporated herein, in their entirety, by this reference. As an option for embodiments of the present invention, the rinsing and drying of the surface of the plated metal is accomplished using localized proximity head rinsing and drying and includes using a proximity head to confine a volume of rinsing fluid within an area beneath the proximity head. Preferably, the area is less than an entirety of the wafer surface.

Step 27 includes chemically removing an amount of the overburden metal formed in step 24. More specifically, step 27 involves chemically removing a portion of the thickness of the overburden metal. Step 27 is intentionally performed so that the overburden metal is not completely removed and so that a sufficient amount of overburden metal remains to permit effective planarization of the gapfill metal in the holes. In preferred embodiments, about 90% of the thickness of the overburden metal is removed using step 27. According to a preferred embodiment of the present invention, step 24, step 25, and step 27 are performed while holding the wafer in the first process chamber.

As an option for some embodiments of the present invention the removal of the amount of overburden metal can be accomplished by chemically reacting the overburden metal with liquids or liquid solutions that dissolve or otherwise remove the overburden metal. For embodiments of the present invention that deposit copper as the gapfill metal, the partial removal of the overburden copper can be accomplished using solutions such as, but not limited to, one or more of nitric acid, sulfuric acid, phosphoric acid, ammonium hydroxide, and ammonium sulfate. Numerous methods for etching copper are known to persons of ordinary skill in the art.

For preferred embodiments of the present invention, removal of the portion of the overburden metal is accomplished with a localized proximity head. More specifically, chemical removal of the portion of overburden metal is accomplished by localized proximity head chemical etching. According to one embodiment of the present invention, chemically removing the portion of overburden metal is accomplished by localized proximity head chemical etching using a second proximity head to confine a volume of chemical etching fluid within an area beneath the second proximity head. Preferably, the area is less than an entirety of the wafer surface.

Step 28 includes using chemical mechanical planarization to complete the removal of the overburden metal left in step 26 and to isolate and planarize the gapfill metal in the holes. Suitable processes for chemical mechanical planarization are known to persons of ordinary skill in the art; consequently, details of the chemical mechanical planarization process will not be presented here. According to preferred embodiments of the present invention, step 28 is performed in a chemical mechanical planarization process chamber. Preferably, step 28 includes moving the wafer to a chemical mechanical planarization chamber.

Figure 2:
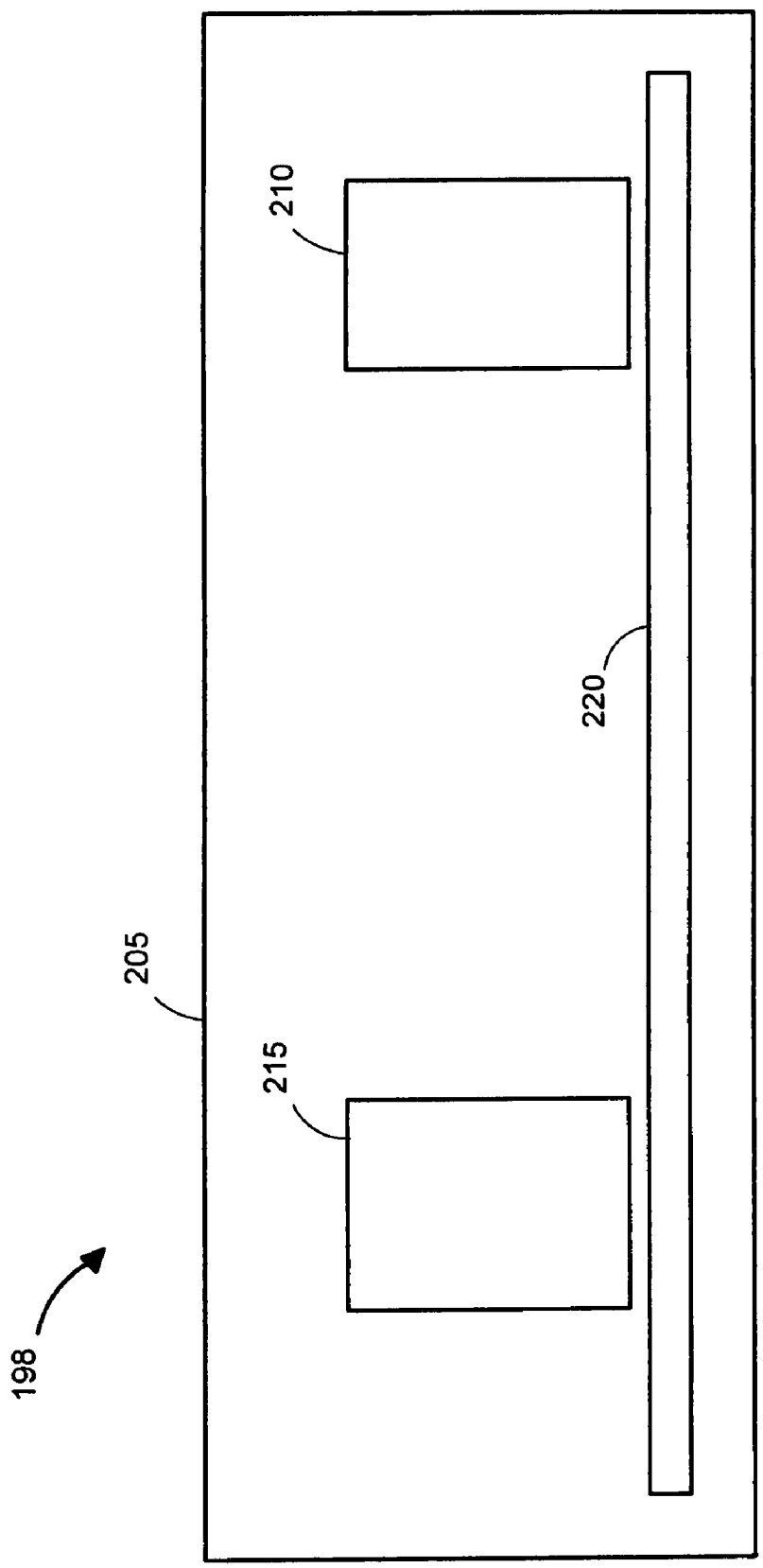
FIG. 2 is a diagram of an embodiment of the present invention.

Reference is now made to FIG. 2 where there is shown a diagram of an integrated system 198 for processing a wafer such as a semiconductor wafer or other wafer having holes for through-hole vias for three-dimensional integrated circuits. More specifically, system 198 is configured to accomplish metal gapfill of the holes and reducing the amount of overburden metal from the gapfill. System 198 includes a process chamber 205 for containing the wafer, a plating component 210, and a deplating component 215. Plating component 210 is integrated with process chamber 205. Plating component 210 is configured to electrochemically plate a gapfill metal onto the wafer to fill the holes. According to a preferred embodiment, plating component 210 is configured to electrochemically plate a conformal layer of the gapfill metal. Deplating component 215 is integrated with process chamber 205. Deplating component 215 is configured to chemically or to electrochemically remove a portion of the overburden metal formed by plating component 210. For illustration purposes, FIG. 2 also shows a wafer 220 placed in process chamber 205 for processing.

As an option for one embodiment of the present invention, plating component 210 comprises a first proximity head configured to be placed over the surface of wafer 220. Detailed descriptions of proximity heads suitable for plating component 210 are presented in commonly owned U.S. Pat. No. 7,153,400; the contents of which are incorporated herein, in their entirety, by this reference. The first proximity head uses a first fluid electrically charged as an anode for depositing a metallic layer over the surface of a wafer 220. The first fluid is capable of being generated between the proximity head and the surface of wafer 220.

Another option for embodiments of the present invention includes having deplating component 215 comprise a second proximity head configured to be placed over the surface of wafer 220. Detailed descriptions of proximity heads suitable for deplating component 215 are presented in commonly owned patents and/or patent applications U.S. Pat. No. 7,153, 400. The second proximity head uses a second fluid electrically charged as a cathode for enabling a consumable chemical reaction over the surface of the wafer so that a portion of the thickness of the overburden metal is consumed. The second fluid is capable of being generated between the second proximity head and the surface of wafer 220 to remove at least a portion of the overburden metal.

An alternative option for embodiments of the present invention includes having deplating component 215 comprise a second proximity head configured to be placed over the surface of wafer 220. Detailed descriptions of proximity heads that can be configured for deplating component 215 are presented in commonly owned U.S. Pat. No. 7,153,400. The second proximity head uses a second fluid having chemical properties enabling a consumable chemical reaction over the surface wafer 220 so that a portion of the thickness of the overburden metal is consumed. For embodiments of the present invention that deposit copper as the gapfill metal, the partial removal of the overburden copper can be accomplished with solutions containing one or more of nitric acid, sulfuric acid, phosphoric acid, ammonium hydroxide, and ammonium sulfate for the second fluid. The second fluid is capable of being generated between the second proximity head and the surface of wafer 220 to remove at least a portion of the overburden metal.

Figure 3:
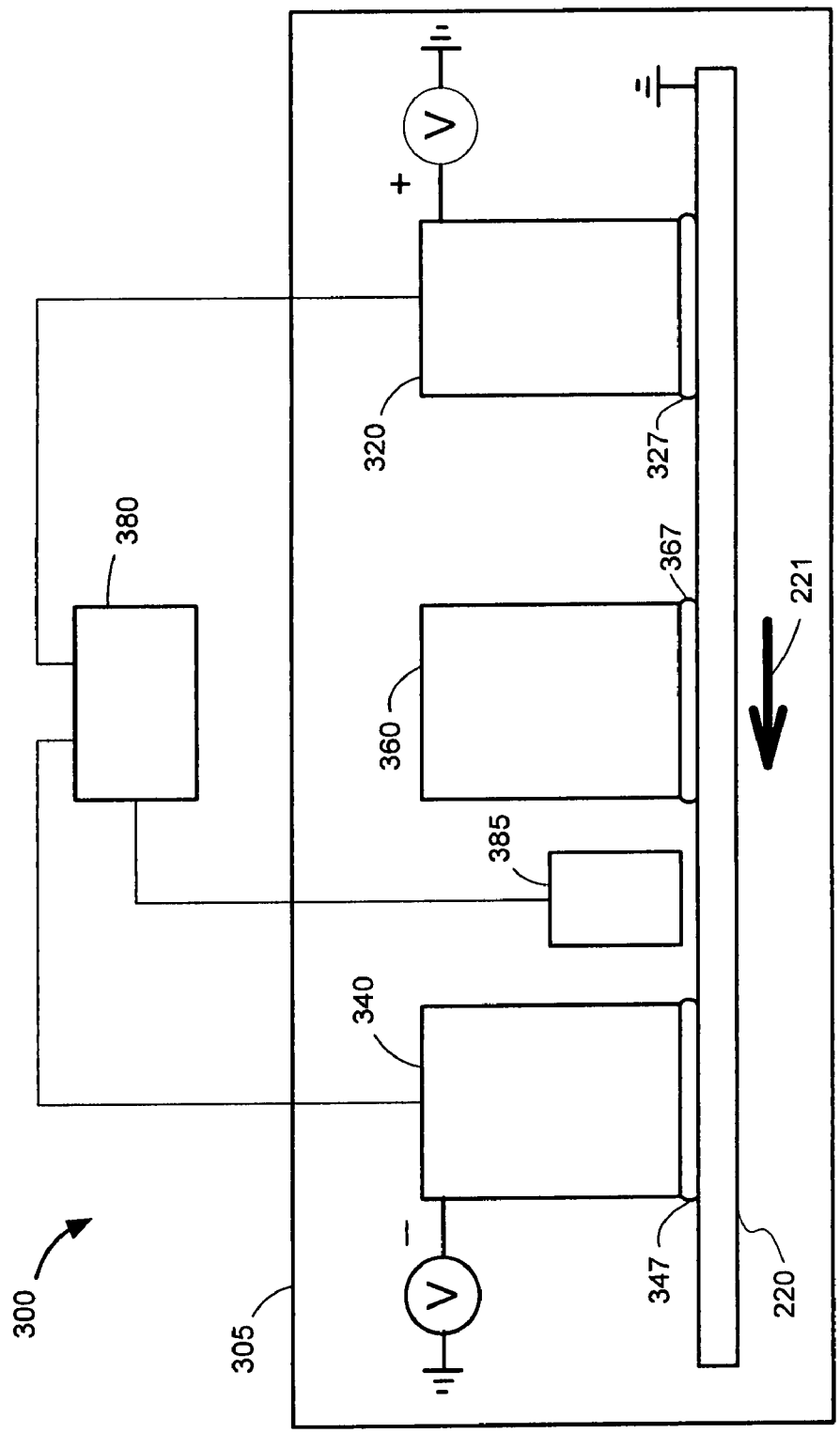
FIG. 3 is a diagram of an embodiment of the present invention.

Reference is now made to FIG. 3 where there is shown a diagram of an integrated system 300 for processing a wafer 220 such as a semiconductor wafer or other wafer having holes for through-hole vias for three-dimensional integrated circuits. More specifically, system 300 is configured to accomplish metal gapfill of the holes and reducing the amount of overburden metal from the gapfill. System 300 includes a process chamber 305 for containing the wafer, a plating head 320, a deplating head 340, a rinse-dry head 360, a controller 380, and a sensor 385.

Plating head 320 is integrated with process chamber 305. Plating head 320 is configured to electrochemically plate a gapfill metal such as copper onto wafer 220 to fill the holes. According to a preferred embodiment, plating head 320 is configured to electrochemically plate a conformal layer of the gapfill metal. Rinse-dry head 360 is integrated with process chamber 305. In a preferred embodiment, rinse-dry head 360 is disposed between plating head 320 and deplating head 340. Rinse-dry head 360 is configured to clean and dry the surface of the gapfill metal. Deplating head 340 is integrated with process chamber 305. Deplating head 340 is configured to electrochemically remove a portion of the thickness of the overburden metal formed by plating head 320. For illustration purposes, FIG. 3 also shows wafer 220 placed in process chamber 305 for processing. During the operation of integrated system 300, wafer 220 is electrically grounded.

As an option for one embodiment of the present invention, plating head 320 comprises a first proximity head configured to be placed over the surface of wafer 220. Detailed descriptions of proximity heads suitable for plating head 320 are presented in commonly owned U.S. patents and/or patent application Ser. No. 10/879,396, filed Jun. 28, 2004; Ser. No. 10/879,263, filed Jun. 28, 2004; and U.S. Pat. No. 7,153,400; the contents of all of these patents and/or patent applications are incorporated herein, in their entirety, by this reference. The first proximity head uses a first fluid electrically charged as an anode for depositing a metallic layer over the surface of wafer 220. The first fluid is capable of being generated between the proximity head and the surface of wafer 220. The first proximity head confines a volume 327 of the first fluid beneath the first proximity head. In a preferred embodiment, the first fluid is confined to an area less than an entirety of the wafer surface.

Another option for embodiments of the present invention includes having deplating head 340 comprise a second proximity head configured to be placed over the surface of wafer 220. Detailed descriptions of proximity heads suitable for deplating head 340 are presented in commonly owned U.S. patents and/or patent application Ser. No. 10/879,396, filed Jun. 28, 2004; Ser. No. 10/879,263, filed Jun. 28, 2004; and U.S. Pat. No. 7,153,400; the contents of all of these patents and/or patent applications are incorporated herein, in their entirety, by this reference. The second proximity head uses a second fluid electrically charged as a cathode for enabling a consumable chemical reaction over the surface of the wafer so that a portion of the thickness of the overburden metal is consumed. The second fluid is capable of being generated between the second proximity head and the surface of wafer 220 to remove at least a portion of the thickness of the overburden metal. The second proximity head confines a volume 347 of the second fluid beneath the second proximity head. In a preferred embodiment, the second fluid is confined to an area less than an entirety of the wafer surface.

As another option, rinse-dry head 360 includes a third proximity head configured to be placed over the surface of the wafer. The third proximity head uses a third fluid to rinse the surface of the wafer. Third fluid is generated between the third proximity head and the surface wafer 220. More specifically, the third proximity head confines a volume 376 of the third fluid beneath the third proximity head. In a preferred embodiment, the third fluid is confined to an area less than an entirety of the wafer surface. Detailed descriptions of proximity heads suitable for rinse-dry head 360 are presented in commonly owned U.S. Pat. No. 7,198,055 and U.S. patent application Ser. No. 10/261,839, filed Sep. 30, 2002; the contents of all of these patents and/or patent applications are incorporated herein, in their entirety, by this reference.

A preferred embodiment of integrated system 300 is configured so that plating head 320 comprises a first proximity head configured to be placed over the surface of wafer 220, deplating head 340 comprises a second proximity head configured to be placed over the surface wafer 320, and rinse-dry head 360 comprises a third proximity head configured to be placed over the surface of wafer 220. The first proximity head uses a first fluid electrically charged as an anode for depositing the gapfill metal layer over the surface of wafer 220. The first fluid is capable of being generated between the proximity head and the surface of wafer 220. The first proximity head confines a volume 327 of the first fluid beneath the first proximity head. In a preferred embodiment, the first fluid is confined to an area less than an entirety of the wafer surface. The second proximity head uses a second fluid electrically charged as a cathode for enabling a consumable chemical reaction over the surface of the wafer so that a portion of the thickness of the overburden metal is consumed. The second fluid is capable of being generated between the second proximity head and the surface of wafer 220 to remove at least a portion of the overburden metal. The second proximity head confines a volume 347 of the second fluid beneath the second proximity head. The third proximity head uses a third fluid to rinse the surface of the wafer. Third fluid is generated between the third proximity head and the surface of wafer 220. More specifically, the third proximity head confines a volume 367 of the third fluid beneath the third proximity head. In a preferred embodiment, the third fluid is confined to an area less than an entirety of the wafer surface.

Integrated system 300 has controller 380 connected with sensor 385 so that controller 380 is responsive to sensor 385. Controller 380 is also connected with plating head 320 and, as an option, is connected with deplating head 340 so as to control the operation of plating head 320 and deplating head 340. Preferably, controller 380 is connected with plating head 320 and deplating head 340 to control the operation of plating head 320 and the operation of deplating head 340.

In a preferred embodiment of the present invention, sensor 385 is configured for measuring the thickness of the overburden metal produced by plating head 320. Controller 380 is configured to adjust one or more control parameters for plating head 320 and/or one or more control parameters for deplating head 340 so as to produce a deplating rate responsive to measurements of the plating rate. As a further embodiment, controller 380 is configured to adjust at least one control parameter to produce a deplating rate responsive to sensor 385 configured as a plating rate sensor. Possible control parameters for deplating head 340 that can be adjusted by controller 380 to produce a deplating rate responsive to sensor 385 include, but are not limited to, electrical current, voltage, electrical power, fluid flow rate, fluid pressure, and fluid pressure within the membrane cavity.

As an option for a preferred embodiment of the present invention, controller 380 is configured to produce a deplating rate that is equal to about 90% of the plating rate for the overburden metal. In other words, 90% of the overburden metal thickness produced by plating head 320 is removed by deplating head 340. Other embodiments of the present invention may use deplating rates for the overburden metal in the range of about 70% to about 95% of the plating rate of the overburden metal.

Alternatively, the sensor 385 may be disposed and configured so as to measure the deplating rate for the overburden metal. For such an embodiment of the present invention, controller 380 would be configured to be responsive to the deplating rate signals and to adjust at least one control parameter for deplating head 340 so as to adjust the deplating rate. Possible control parameters for deplating head 340 that can be adjusted by controller 380 to produce a deplating rate responsive to sensor 385 include, but are not limited to, electrical current, voltage, electrical power, fluid flow rate, fluid pressure, and fluid pressure within the membrane cavity.

According to one embodiment of the present invention, sensor 385 is configured as an eddy current sensor to measure the thickness of a metallic layer such as the overburden for a gapfill metal. As an option, sensor 385 may be disposed independently at a position with respect to the surface of wafer 220 so as to measure the thickness of the overburden metal. Alternatively, sensor 385 may be integrated into plating head 320, deplating head 340, or rinse-dry head 360. Of course, other techniques for measuring the thickness of the overburden metal can be used. For a more detailed description of the functionality of eddy current sensors, reference can be made to commonly owned U.S. Pat. No. 7,128,803, entitled "Integration of Sensor Based Metrology into Semiconductor Processing Tools", filed on Jun. 28, 2002, which is incorporated herein, in its entirety, by reference.

As indicated above, FIG. 3 shows a preferred configuration for system 300. In this configuration, controller 380 is connected with sensor 385 so as to receive measurements of the thickness of the overburden metal. Controller 380 is also connected with plating head 320 and with deplating head 340 so as to control the plating rate produced by plating head 320 and the deplating rate produced by deplating head 340. Another benefit offered by the configuration shown in FIG. 3 is that the plating rate can be adjusted to accommodate limitations that could occur for deplating head 340 in producing the necessary deplating rate.

In preferred embodiments of integrated system 300, plating head 320, deplating head 340, and rinse-dry head 360, each processes an area of the wafer that is smaller than the total wafer area so that the surface of wafer 220 experiences localized processing. The surface of wafer 220 is scanned by plating head 320, deplating head 340, and rinse-dry head 360. The surface of wafer 220 may be scanned by translating the wafer with respect to plating head 320, deplating head 340, and rinse-dry head 360. Alternatively, wafer 220 may be fixed while plating head 320, deplating head 340, and rinse-dry head 360 are translated. In other words, process chamber 305 is configured to translate wafer 220 or to translate plating head 320, deplating head 340, and rinse-dry head 360. The surface of wafer 220 can be scanned in any number of ways. The exemplary embodiment of the present invention shown in FIG. 3 performs a linear motion scan. More specifically, wafer 220 is translated in a direction shown by arrow 221 during processing.

Figure 4:
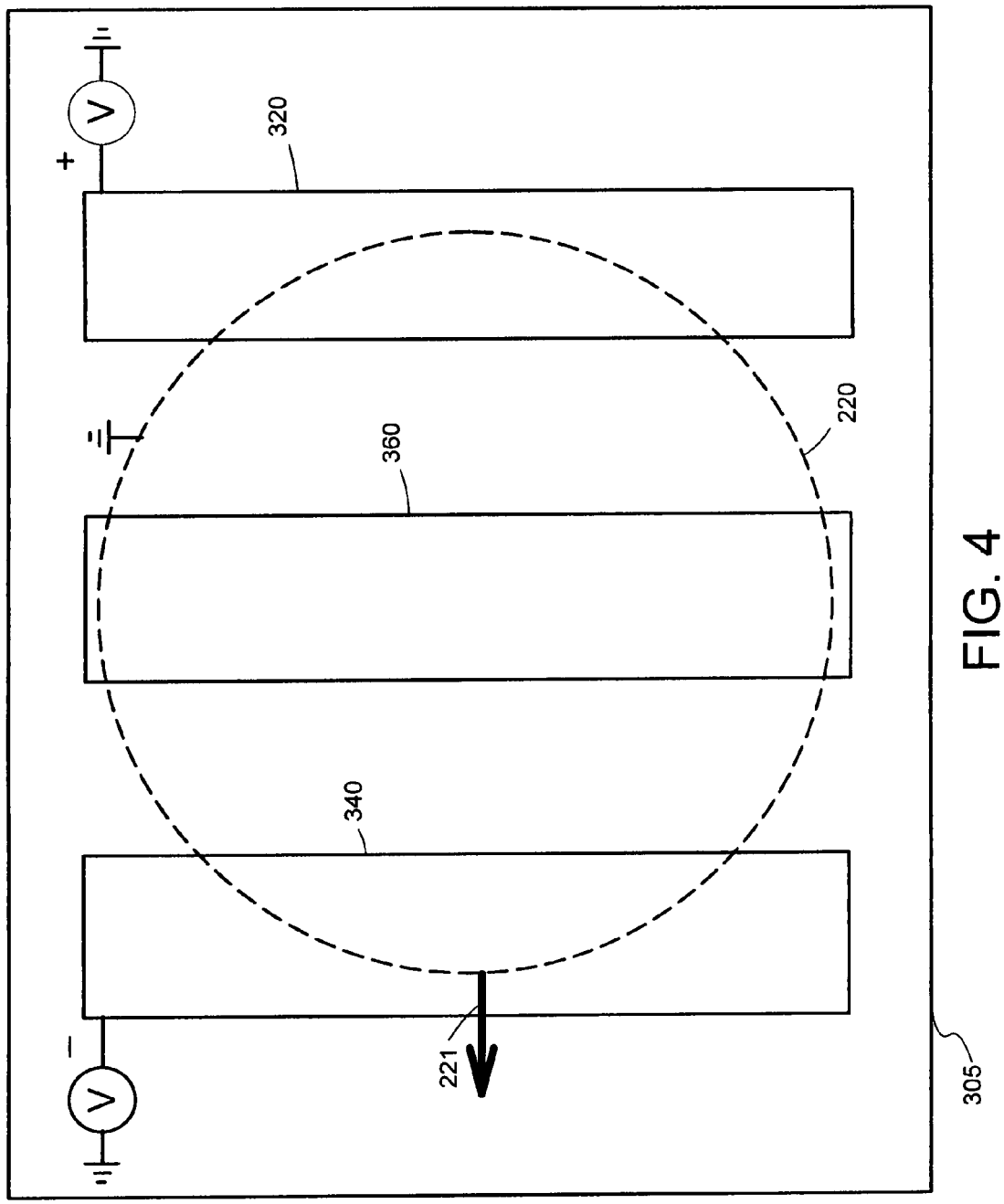
FIG. 4 is a diagram of an embodiment of the present invention.

FIG. 4 shows a top view of process chamber 305, plating head 320, deplating head 340, and rinse dry head 360 for an embodiment of integrated system 300 shown in FIG. 3. In FIG. 4, plating head 320, deplating head 340, and rinse dry head 360 each have an elongated processing area, according to a preferred embodiment of the present invention. The long dimension of the processing area is greater than or equal to the diameter of the wafer. Any other suitable type of configuration that would enable relative movement of plating head 320, deplating head 340, and rinse-dry head 360 with respect to the surface of wafer 220 may be utilized.

As an option for some embodiments of the present invention, the surface of wafer 220 may be processed by performing multiple scans with plating head 320, deplating head 340, and rinse-dry head 360. More specifically, the surface of wafer 220 may be scanned multiple times wherein each scan adds a portion of the gapfill metal to fill the holes and each scan removes a portion of the thickness of the overburden metal. The scan is repeated until the holes are substantially filled and the desired amount of thickness of the overburden metal is removed. Another option for scanning wafer 220 includes using one or more of the scans only to accomplish plating or only to accomplish deplating so as to achieve the desired gapfill of the holes and the desired thickness removal for the overburden metal.

Figure 5:
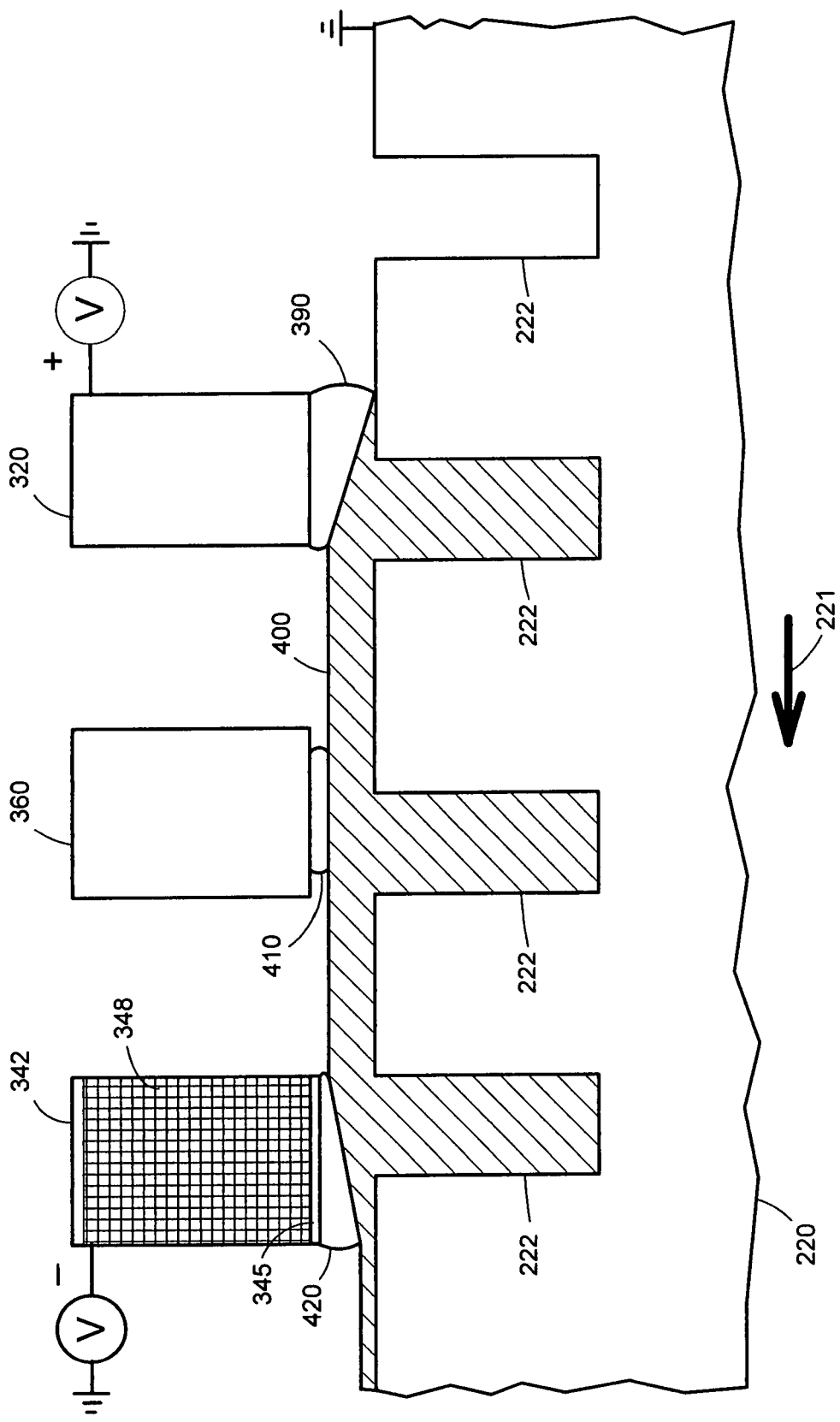
FIG. 5 is a diagram of an embodiment of the present invention.

Reference is now made to FIG. 5 which further illustrates the operation of a preferred embodiment of integrated system 300. More specifically, FIG. 5 shows a magnified cross-sectional side view of wafer 220 having holes 222 for through hole vias. FIG. 5 also shows plating head 320, deplating head 342, and rinse-dry head 360 processing wafer 220. FIG. 5 is provided for illustration purposes; items shown in FIG. 5 are not drawn to scale. Arrow 221 shown in FIG. 5 illustrates the relative motion of wafer 220 with respect to plating head 320, deplating head 342, and rinse-dry head 360.

As shown in FIG. 5, wafer 220 is electrically grounded. As the surface of wafer 220 is translated toward plating head 320 a plating meniscus 390 provided by plating head 320 contacts the surface of wafer 220. Plating meniscus 390 comprises an electroplating fluid for localized plating of gapfill metal. Plating head 320 forms plated metal 400 on wafer 220. Plated metal 400 is shown present in holes 222 that have been processed, and plated metal 400 is shown present on the surface of wafer 220 above holes 222. The portion of plated metal 400 extending over the surface of wafer 220 above the level of the openings for holes 222 comprises the overburden metal.

Rinse-dry head 360 provides a rinse-dry meniscus 410 comprising a fluid for rinsing the surface of plated metal 400 after passage of plating head 320 over the surface of wafer 220. More specifically, rinse-dry head 360 provides localized rinsing of the surface of plated metal 400 and localized drying of the surface of plated metal 400. Rinse-dry head 360 is configured to substantially clean the surface of plated metal 400 of any remaining electroplating fluid from plating head 320.

Deplating head 342, shown in FIG. 5, is essentially the same as deplating head 340, shown in FIG. 3, with the exception that deplating head 342 includes a cation transfer membrane 345 configured to accomplish membrane mediated electrochemical deplating of the gapfill metal. Deplating head 342 generates a deplating meniscus 420. According to a preferred embodiment, deplating meniscus 420 is formed by providing a low conductivity solvent such as deionized water between deplating head 342 and plated metal 400.

Deplating head 342 is configured to be placed over the surface of wafer 220 so that one side of cation transfer membrane 345 contacts the deionized water. Deplating head 342 uses cation transfer membrane 345 to enable removal of a portion of the thickness of the overburden metal. Deplating head 342 includes a negatively biased electrolyte solution 348. Cation transfer membrane 345 is arranged so as to separate the deionized water from negatively biased electrolyte solution 348. In other words, negatively biased electrolyte solution 348 is held on the side of cation transfer membrane 345 opposite that of the deionized water or other low conductivity solvent.

Deplating head 342 causes cations generated from plated metal 400 to form in the deionized water contacting plated metal 400. In other words, electrolyte solution 348 is electrically charged as a cathode for enabling a consumable chemical reaction involving plated metal 400. The cations are conveyed from the deionized water by way of cation transfer membrane 345 to negatively biased electrolyte solution 348, effecting a reduction in the thickness of plated metal 400 contacting or near the cation transfer membrane.

Examples of cation transfer membrane 345 for some embodiments of the present invention include, but are not limited to, perfluorosulfonic acid/polytetrafluoroethylene copolymer and perfluorocarboxylic acid/polytetrafluoroethylene copolymer. For applications using copper as the gapfill metal, a preferred embodiment of the present invention has cation transfer membrane 345 comprising perfluorosulfonic acid/polytetrafluoroethylene copolymer. Detailed descriptions of membrane mediated electrochemical etching are provided in commonly owned U.S. patent application Ser. No. 11/395,881, filed Mar. 31, 2006; and Ser. No. 11/394,777, filed Mar. 31, 2006; the contents of all of these applications are incorporated herein, in their entirety, by this reference.

According to a preferred embodiment of the present invention, plating head 320 comprises a first proximity head configured to be placed over the surface of the wafer. The first proximity head provides a first fluid electrically charged as an anode for depositing a metallic layer over the surface of the wafer. The first proximity head generates the first fluid between the first proximity head and the surface of the wafer.

Deplating head 342 comprises a second proximity head configured to be placed over the surface of the wafer. The second proximity head includes a cation transfer membrane 345 and an electrolyte solution 348 electrically charged as a cathode. The second proximity head generates a low conductivity solvent such as deionized water between the second proximity head and the surface of the wafer. Cation transfer membrane 345 is placed between electrolyte solution 348 and the low conductivity solvent so that cations are conveyed from the low conductivity solvent, through cation transfer membrane 345 to electrolyte solution 348. The integrated system further comprises a rinse-dry head 360 disposed between the plating head 320 and deplating head 342. Rinse dry head 360 is configured to clean and dry the surface of the plated metal. Rinse dry head 360 comprises a third proximity head configured to be placed over the surface of the wafer. Rinse dry head 360 provides a third fluid to rinse the surface of the wafer. The third fluid is capable of being generated between the third proximity head and the surface of the wafer.

As an option for some embodiments of the present invention, the surface of wafer 220 may be processed by performing multiple scans with plating head 320, deplating head 342, and rinse-dry head 360. More specifically, the surface of wafer 220 may be scanned multiple times wherein each scan adds a portion of the gapfill metal to fill the holes and each scan removes a portion of the thickness of the overburden metal. The scan is repeated until the holes are substantially filled and the desired amount of thickness of the overburden metal is removed. An additional benefit of using deplating head 342 for multiple scan processing for gapfill and removal of overburden metal is that the membrane mediated operation of deplating head 342 is more effective in removing areas of plated metal 400 that are in contact with or nearest the surface of cation transfer membrane 345. This means that the overburden metal removal can be accomplished with deplating head 342 with little or no removal of plated metal below the openings for holes 222. This is also true for multiple scans in which there is only partial fill of holes 222 with each scan. In other words, the deplating effect is reduced because cation transfer membrane 345 does not contact the surface of plated metal 400 that partially fills holes 222 and is below the openings of holes 222.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

As used herein, the terms "comprises," "comprising," "includes," "including," "has," "having," "at least one of," or any other variation thereof, are intended to cover a non-exclusive inclusion. For example, a process, method, article, or apparatus that comprises a list of elements is not necessarily limited only to those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Further, unless expressly stated to the contrary, "at least one of" is to be interpreted to mean "one or more." For example, a process, method, article, or apparatus that comprises one or more of a list of elements and if one or more of the elements comprises a sub-list of sub-elements, then the sub-elements are to be considered in the same manner as the elements. For example, at least one of A and B is satisfied by any one of the following: A is true (or present) and B is false (or not present), A is false (or not present) and B is true (or present), and both A and B are true (or present).

What is claimed is:

1. An integrated system for processing a wafer having holes for integrated circuits, the system comprising:
    a process chamber for containing the wafer;
    an electrical connection to connect with the wafer to electrically ground the wafer;
    a plating component integrated with the process chamber, the plating component being configured to electrochemically plate a gapfill metal layer onto the wafer to substantially fill the holes;
    a deplating component integrated with the process chamber, the deplating component being configured to electrochemically remove a portion of overburden metal formed by the plating component;
    the plating component and the deplating component being disposed so as to operate on the wafer substantially simultaneously; and
    a controller configured to adjust one or more control parameters for the plating component and one or more control parameters for the deplating component so as to produce a deplating rate responsive to measurements of the plating rate.

2. The integrated system of claim 1, wherein the plating component comprises a first proximity head configured to be placed over the surface of the wafer, a first fluid electrically charged as an anode for depositing the gapfill metal layer over the surface of the wafer, the first fluid being capable of being generated between the proximity head and the surface of the wafer.

3. The integrated system of claim 1, wherein the deplating component comprises a second proximity head configured to be placed over the surface of the wafer, a second fluid electrically charged as a cathode for enabling a consumable chemical reaction over the surface of the wafer, the second fluid being capable of being generated between the second proximity head and the surface of the wafer to remove at least a portion of the overburden metal.

4. The integrated system of claim 1, wherein the deplating component comprises a second proximity head configured to be placed over the surface of the wafer, a second fluid having chemical properties enabling a consumable chemical reaction over the surface of the wafer, the second fluid being capable of being generated between the second proximity head and the surface of the wafer to remove at least a portion of the overburden metal.

5. The integrated system of claim 1, wherein the deplating component comprises a second proximity head configured to be placed over the surface of the wafer, the second proximity head having a cation transfer membrane; an electrolyte solution contained in the second proximity head, the electrolyte solution being electrically charged as a cathode for enabling a consumable chemical reaction over the surface of the wafer, and a low conductivity solvent capable of being generated between the cation transfer membrane and the surface of the wafer to remove at least a portion of the overburden metal.

6. The integrated system of claim 1, wherein the deplating component comprises a second proximity head configured to be placed over the surface of the wafer, the second proximity head having a cation transfer membrane comprising perfluorosulfonic acid/polytetrafluoroethylene copolymer or perfluorocarboxylic acid/polytetrafluoroethylene copolymer; an electrolyte solution contained in the second proximity head, the electrolyte solution being electrically charged as a cathode for enabling a consumable chemical reaction over the surface of the wafer, and a low conductivity solvent capable of being generated between the cation transfer membrane and the surface of the wafer to remove at least a portion of the overburden metal.

7. The integrated system of claim 1, further comprising a rinse-dry component disposed between the plating component and the deplating component, the rinse dry component being configured to clean and dry the surface of the gapfill metal.

8. The integrated system of claim 1, further comprising a rinse-dry component disposed between the plating component and the deplating component, the rinse dry component being configured to clean and dry the surface of the gapfill metal; the rinse dry component having a third proximity head configured to be placed over the surface of the wafer, a third fluid to rinse the surface of the wafer being capable of being generated between the third proximity head and the surface of the wafer.

9. The integrated system of claim 1, wherein the plating component comprises a first proximity head configured to be placed over the surface of the wafer, a first fluid electrically charged as an anode for depositing a metallic layer over the surface of the wafer, the first fluid being capable of being generated between the proximity head and the surface of the wafer and the deplating component comprises a second proximity head configured to be placed over the surface of the wafer, a second fluid having chemical properties enabling a consumable chemical reaction over the surface of the wafer, the second fluid being capable of being generated between the second proximity head and the surface of the wafer to remove at least a portion of the overburden metal.

10. The integrated system of claim 1, wherein the plating component comprises a first proximity head configured to be placed over the surface of the wafer, a first fluid electrically charged as an anode for depositing a metallic layer over the surface of the wafer, the first fluid being capable of being generated between the proximity head and the surface of the wafer and the deplating component comprises a second proximity head configured to be placed over the surface of the wafer, a second fluid electrically charged as a cathode for enabling a consumable chemical reaction over the surface of the wafer, the second fluid being capable of being generated between the proximity head and the surface of the wafer to remove at least a portion of the overburden metal.

11. The integrated system of claim 1, wherein the plating component comprises a first proximity head configured to be placed over the surface of the wafer, a first fluid electrically charged as an anode for depositing a metallic layer over the surface of the wafer, the first fluid being capable of being generated between the proximity head and the surface of the wafer and the deplating component comprises a second proximity head configured to be placed over the surface of the wafer, the second proximity head having a cation transfer membrane; an electrolyte solution contained in the second proximity head, the electrolyte solution being electrically charged as a cathode for enabling a consumable chemical reaction over the surface of the wafer, and a low conductivity solvent capable of being generated between the cation transfer membrane and the surface of the wafer to remove at least a portion of the overburden metal.

12. The integrated system of claim 1, wherein the plating component comprises a first proximity head configured to be placed over the surface of the wafer, a first fluid electrically charged as an anode for depositing a metallic layer over the surface of the wafer, the first fluid being capable of being generated between the proximity head and the surface of the wafer and the deplating component comprises a second proximity head configured to be placed over the surface of the wafer, the second proximity head having a cation transfer membrane comprising perfluorosulfonic acid/polytetrafluoroethylene copolymer or perfluorocarboxylic acid/polytetrafluoroethylene copolymer; an electrolyte solution contained in the second proximity head, the electrolyte solution being electrically charged as a cathode for enabling a consumable chemical reaction over the surface of the wafer, and a low conductivity solvent capable of being generated between the cation transfer membrane and the surface of the wafer to remove at least a portion of the overburden metal.

13. The integrated system of claim 1, further comprising a rinse-dry component disposed between the plating component and the deplating component, the rinse dry component being configured to clean and dry the surface of the gapfill metal; the rinse dry component having a third proximity head configured to be placed over the surface of the wafer, a third fluid to rinse the surface of the wafer being capable of being generated between the third proximity head and the surface of the wafer and wherein the plating component comprises a first proximity head configured to be placed over the surface of the wafer, a first fluid electrically charged as an anode for depositing a metallic layer over the surface of the wafer, a first fluid being capable of being generated between the proximity head and the surface of the wafer and the deplating component comprises a second proximity head configured to be placed over the surface of the wafer, the second proximity head having a cation transfer membrane; an electrolyte solution contained in the second proximity head, the electrolyte solution being electrically charged as a cathode for enabling a consumable chemical reaction over the surface of the wafer, and a low conductivity solvent capable of being generated between the cation transfer membrane and the surface of the wafer to remove at least a portion of the overburden metal.

14. The integrated system of claim 1, further comprising a rinse-dry component disposed between the plating component and the deplating component, the rinse dry component being configured to clean and dry the surface of the gapfill metal; the rinse dry component having a third proximity head configured to be placed over the surface of the wafer, a third fluid to rinse the surface of the wafer being capable of being generated between the third proximity head and the surface of the wafer and wherein the plating component comprises a first proximity head configured to be placed over the surface of the wafer, a first fluid electrically charged as an anode for depositing a metallic layer over the surface of the wafer, the third fluid being capable of being generated between the proximity head and the surface of the wafer and the deplating component comprises a second proximity head configured to be placed over the surface of the wafer, the second proximity head having a cation transfer membrane comprising perfluorosulfonic acid/polytetrafluoroethylene copolymer or perfluorocarboxylic acid/polytetrafluoroethylene copolymer; an electrolyte solution contained in the second proximity head, the electrolyte solution being electrically charged as a cathode for enabling a consumable chemical reaction over the surface of the wafer, and a low conductivity solvent capable of being generated between the cation transfer membrane and the surface of the wafer to remove at least a portion of the overburden metal.

15. The integrated system of claim 1, wherein the gapfill metal comprises copper.

16. The integrated system of claim 1, further comprising a plating rate sensor and a controller responsive to the plating rate sensor, the controller being configured to adjust at least one control parameter to produce a deplating rate responsive to a signal from the plating rate sensor.

17. The integrated system of claim 1, further comprising a plating rate sensor and a controller responsive to the plating rate sensor, the controller being configured to adjust at least one of the parameters:
electrical current,
voltage,
electrical power,
fluid flow rate,
fluid pressure, and
fluid pressure within the membrane cavity,
to produce a deplating rate responsive to a signal from the plating rate sensor.

18. The integrated system of claim 1, further comprising a deplating rate sensor and a controller responsive to the deplating rate sensor, the controller being configured to adjust at least one of the parameters:
electrical current,
voltage,
electrical power,
fluid flow rate,
fluid pressure, and
fluid pressure within the membrane cavity
to produce a plating rate responsive to a signal from the deplating rate sensor.

19. In a combination,
a process chamber for containing a semiconductor wafer having holes for through-hole vias for three-dimensional integrated circuits;
an electrical connection to connect with the semiconductor wafer to electrically ground the semiconductor wafer;
a plating component integrated with the process chamber, the plating component being configured to electrochemically plate a substantially conformal layer of a gapfill metal onto the semiconductor wafer to at least partially fill the holes;
a rinse and dry component integrated with the process chamber, the rinse and dry component being configured to rinse and dry the gapfill metal;
a deplating component integrated with the process chamber, the deplating component having a cation transfer membrane, a negatively biased electrolyte solution, and deionized water configured so as to mediate electrochemical removal of a portion of overburden metal formed by the plating component;
a sensor configured to measure the thickness of the overburden metal; and
a controller responsive to the sensor, the controller being connected with:
the plating component and
the deplating component
the controller being configured to adjust one or more control parameters for the plating component and one or more control parameters for the deplating component so as to produce a deplating rate of 70% to 95% of the plating rate.

20. An integrated system for processing a wafer having holes for integrated circuits, the system comprising:
a process chamber for containing the wafer;
an electrical connection connected with the wafer to electrically ground the wafer;
a plating component integrated with the process chamber, the plating component being configured to electrochemically plate a gapfill metal layer onto the wafer to substantially fill the holes;
a deplating component integrated with the process chamber, the deplating component being configured to electrochemically remove a portion of overburden metal formed by the plating component;
the plating component and the deplating component being disposed so as to operate on the wafer substantially simultaneously; and
a controller being configured to adjust one or more control parameters for the plating component and one or more control parameters for the deplating component so as to produce a deplating rate of 70% to 95% of the plating rate.

21. The integrated system of claim 20, wherein the deplating component comprises a second proximity head configured to be placed over the surface of the wafer, a second fluid electrically charged as a cathode for enabling a consumable chemical reaction over the surface of the wafer, the second fluid being capable of being generated between the second proximity head and the surface of the wafer to remove at least a portion of the overburden metal.

22. The integrated system of claim 20, wherein the deplating component comprises a second proximity head configured to be placed over the surface of the wafer, a second fluid having chemical properties enabling a consumable chemical reaction over the surface of the wafer, the second fluid being capable of being generated between the second proximity head and the surface of the wafer to remove at least a portion of the overburden metal.

23. The integrated system of claim 20, wherein the deplating component comprises a second proximity head configured to be placed over the surface of the wafer, the second proximity head having a cation transfer membrane; an electrolyte solution contained in the second proximity head, the electrolyte solution being electrically charged as a cathode for enabling a consumable chemical reaction over the surface of the wafer, and a low conductivity solvent capable of being generated between the cation transfer membrane and the surface of the wafer to remove at least a portion of the overburden metal.

24. The integrated system of claim 20, wherein the deplating component comprises a second proximity head configured to be placed over the surface of the wafer, the second proximity head having a cation transfer membrane comprising perfluorosulfonic acid/polytetrafluoroethylene copolymer or perfluorocarboxylic acid/polytetrafluoroethylene copolymer; an electrolyte solution contained in the second proximity head, the electrolyte solution being electrically charged as a cathode for enabling a consumable chemical reaction over the surface of the wafer, and a low conductivity solvent capable of being generated between the cation transfer membrane and the surface of the wafer to remove at least a portion of the overburden metal.

25. The integrated system of claim 20, further comprising a rinse-dry component disposed between the plating component and the deplating component, the rinse dry component being configured to clean and dry the surface of the gapfill metal.

26. The integrated system of claim 20, further comprising a rinse-dry component disposed between the plating component and the deplating component, the rinse dry component being configured to clean and dry the surface of the gapfill metal; the rinse dry component having a third proximity head configured to be placed over the surface of the wafer, a third fluid to rinse the surface of the wafer being capable of being generated between the third proximity head and the surface of the wafer.

27. The integrated system of claim 20, wherein the plating component comprises a first proximity head configured to be placed over the surface of the wafer, a first fluid electrically charged as an anode for depositing a metallic layer over the surface of the wafer, the first fluid being capable of being generated between the proximity head and the surface of the wafer and the deplating component comprises a second proximity head configured to be placed over the surface of the wafer, a second fluid having chemical properties enabling a consumable chemical reaction over the surface of the wafer, the second fluid being capable of being generated between the second proximity head and the surface of the wafer to remove at least a portion of the overburden metal.

28. The integrated system of claim 20, wherein the plating component comprises a first proximity head configured to be placed over the surface of the wafer, a first fluid electrically charged as an anode for depositing a metallic layer over the surface of the wafer, the first fluid being capable of being generated between the proximity head and the surface of the wafer and the deplating component comprises a second proximity head configured to be placed over the surface of the wafer, a second fluid electrically charged as a cathode for enabling a consumable chemical reaction over the surface of the wafer, the second fluid being capable of being generated between the proximity head and the surface of the wafer to remove at least a portion of the overburden metal.

29. The integrated system of claim 20, further comprising a plating rate sensor and the controller responsive to the plating rate sensor, the controller being configured to adjust at least one control parameter of the plating component to provide the plating rate that results in the deplating rate being 70% to 95% of the plating rate.

30. The integrated system of claim 20, further comprising a plating rate sensor and the controller responsive to the plating rate sensor, the controller being configured to adjust at least one parameter to make the deplating rate 70% to 95% of the plating rate.

31. The integrated system of claim 20, further comprising a deplating rate sensor and the controller responsive to the deplating rate sensor, the controller being configured to adjust at least one parameter to make the deplating rate 70% to 95% of the plating rate.

* * * * *